(12) United States Patent
Graham et al.

(10) Patent No.: US 9,442,594 B2
(45) Date of Patent: Sep. 13, 2016

(54) RESISTANCE CHANGING SENSOR

(75) Inventors: Mark Andrew Graham, Linthorpe (GB); David Lussey, Tunstall (GB)

(73) Assignee: Peratech Holdco Limited, Richmond, North Yorkshire (GB)

( * ) Notice: Subject to any disclaimer, the term of this patent is extended or adjusted under 35 U.S.C. 154(b) by 471 days.

(21) Appl. No.: 13/247,082

(22) Filed: Sep. 28, 2011

(65) Prior Publication Data

US 2012/0074970 A1    Mar. 29, 2012

(30) Foreign Application Priority Data

Sep. 29, 2010 (GB) ................................. 1016329.3
Sep. 29, 2010 (GB) ................................. 1016330.1

(51) Int. Cl.
*G01R 27/02* (2006.01)
*G06F 3/041* (2006.01)

(52) U.S. Cl.
CPC ........ *G06F 3/0416* (2013.01); *Y10T 29/49004* (2015.01)

(58) Field of Classification Search
CPC .... G06F 3/0416; H01H 3/141; H01H 1/021; G01R 27/02; G01R 31/28; B23P 11/00
USPC .............. 324/661, 691–693, 702; 360/324.2, 360/313; 29/593, 592.1; 252/500; 345/168, 345/173
See application file for complete search history.

(56) References Cited

U.S. PATENT DOCUMENTS

| | | | |
|---|---|---|---|
| 4,301,337 A | 11/1981 | Eventoff | |
| 4,315,238 A | 2/1982 | Eventoff | |
| 6,049,080 A | 4/2000 | Ito | |
| 6,505,521 B1 | 1/2003 | Petri et al. | |
| 2002/0055167 A1* | 5/2002 | Pourahmadi et al. | 435/287.2 |
| 2002/0126100 A1* | 9/2002 | Sandbach | 345/173 |
| 2003/0146902 A1* | 8/2003 | Sandbach et al. | 345/168 |
| 2006/0214202 A1* | 9/2006 | Zorich et al. | 257/294 |
| 2006/0255903 A1* | 11/2006 | Lussey et al. | 338/47 |
| 2006/0260411 A1* | 11/2006 | Fortin et al. | 73/756 |
| 2007/0022828 A1* | 2/2007 | Divigalpitiya et al. | 73/862.041 |

FOREIGN PATENT DOCUMENTS

| | | | | |
|---|---|---|---|---|
| GB | 2367135 A | 3/2002 | | |
| GB | 2432218 A | 5/2007 | | |
| JP | 02085766 A | 3/1990 | | |
| JP | 2007178256 A | 7/2007 | | |
| WO | WO 2009030922 A2 * | 3/2009 | | B25J 13/08 |

* cited by examiner

*Primary Examiner* — Son Le
*Assistant Examiner* — Brent J Andrews
(74) *Attorney, Agent, or Firm* — Arthur Jacob (57) ABSTRACT

A sensor is configured to experience resistance changes in response to an external interaction. The sensor comprises a first layer of a conductive material having a first electrode connected thereto; a second intermediate layer of a material having a resistance sensitive to said external interaction; and a third layer including a first set of fingers interdigitated with a second set of fingers. A second electrode is attached to the first set of fingers and a third electrode is attached to the second set of fingers. The second layer includes a quantum tunnelling composite and provides electrical conduction between the first layer and the third layer. In a preferred embodiment, the first electrode is connected to either one of said second electrode or said third electrode to complete a parallel connection. A method is described for constructing such a sensor.

18 Claims, 11 Drawing Sheets

RESISTANCE CHANGING SENSOR

CROSS REFERENCE TO RELATED APPLICATIONS

This application claims priority from United Kingdom Patent Applications Numbered 10 16 329.3 and 10 16 330.1, both of which were filed 29 Sep. 2010, the whole contents of which are incorporated herein by reference in their entirety.

BACKGROUND OF THE INVENTION

1. Field of the Invention

The present invention relates to a sensor or sensor configured to experience resistance changes in response to an external interaction.

The present application also relates to a method of constructing a sensing device for sensing an external interaction by effecting a change in resistance.

2. Description of the Related Art

A sensor configured to experience resistance changes in response to an external interaction is disclosed in U.S. Pat. No. 6,501,465, assigned to the present assignee. The disclosed sensor deploys conductive fabric layers and increasing applied pressure results in a greater degree of conductivity between the layers such that the resistance of the connection may be measured in order to determine the degree of applied pressure. An acknowledged problem with systems of this type is that they exhibit a wide range of responses such that it is difficult to predict the way in which resistance will change and it is therefore difficult to engineer the sensor for a particular application.

An alternative approach is disclosed in U.S. Pat. No. 6,291,568, assigned to the present assignee, in which a quantum tunnelling composite (manufactured by the present applicant) is deployed as a material with variable resistivity in response to applied pressure. By using a quantum tunnelling composite, it is possible to control the response of the sensor more accurately, although in some configurations the response may be very sensitive to relatively small pressures or it may have an extended range while being less sensitive to an initial press.

There are two known methods for measuring a change in resistance. One way is to have an electrode at the top with a second electrode at the bottom and pressure sensing material sandwiched in between. A voltage is applied and changes in current are detected due to varying changes in resistance.

An alternative method is to have alternate electrodes on the bottom, referred to as interdigitated fingers, with the pressure sensitive material on the top. These known methods produce different force/resistance profiles because the first method defines one resistance while the second method provides two. Different paths are taken and accordingly there is a different resistance profile.

BRIEF SUMMARY OF THE INVENTION

According to an aspect of the present invention, there is provided a sensor configured to experience resistance changes in response to an external interaction, comprising a first layer, a second layer and a third layer, wherein: said first layer is a layer of a conductive material having a first electrode connected thereto; said second layer extends between said first layer and said third layer and said second layer is formed of a material having a resistance sensitive to an external interaction; and said third layer consists of a first set of conductive fingers interdigitated with a second set of conductive fingers, wherein: said first set of fingers has a second electrode attached thereto and said second set of fingers has a third electrode attached thereto; and said second layer is formed of a quantum tunnelling composite.

In an embodiment, the first electrode is electrically connected to one of said second electrode or said third electrode to make a parallel electrical connection. In alternate embodiments, the layer fabricated from quantum tunnelling composite may be directly printed onto the first layer of a conductive material having a first electrode connected thereto or onto the third layer consisting of a first set of fingers interdigitated with a second set of fingers.

According to a second aspect of the present invention, there is provided a method of constructing a sensor for detecting an external interaction by effecting a change in resistance, comprising the steps of: defining a first layer of a conductive material; defining a first layer of a conductive material; attaching a first electrode to said first layer of a conductive material; defining a second intermediate layer of a material having a resistance sensitive to external interactions; defining a third layer consisting of a first set of fingers interdigitated with a second set of fingers; attaching a second electrode to said first set of fingers and attaching a third electrode to said second set of fingers; connecting said first electrode to said second electrode to make a parallel connection; applying a voltage between said parallel connection and the third electrode; and measuring an electrical signal to obtain a measurement which is dependent upon current flowing from said parallel connection to the third electrode.

In an embodiment, the second intermediate layer is fabricated from a quantum tunnelling composite. The layer fabricated from a quantum tunnelling composite may be directly printed onto the first layer of a conductive material having a first electrode connected thereto or onto the third layer consisting of a first set of fingers interdigitated with a second set of fingers.

In an embodiment, an external interaction takes the form of a mechanical interaction caused by the application of force or pressure. In an alternative embodiment, the external interaction involves an interaction with a chemical vapour and the sensor may be deployed primarily as a safety device for detecting harmful vapours. In an alternative embodiment, the external interaction takes the form of an application of electro-magnetic radiation or ionising radiation.

DETAILED DESCRIPTION OF EXAMPLE EMBODIMENTS

Figure 1:
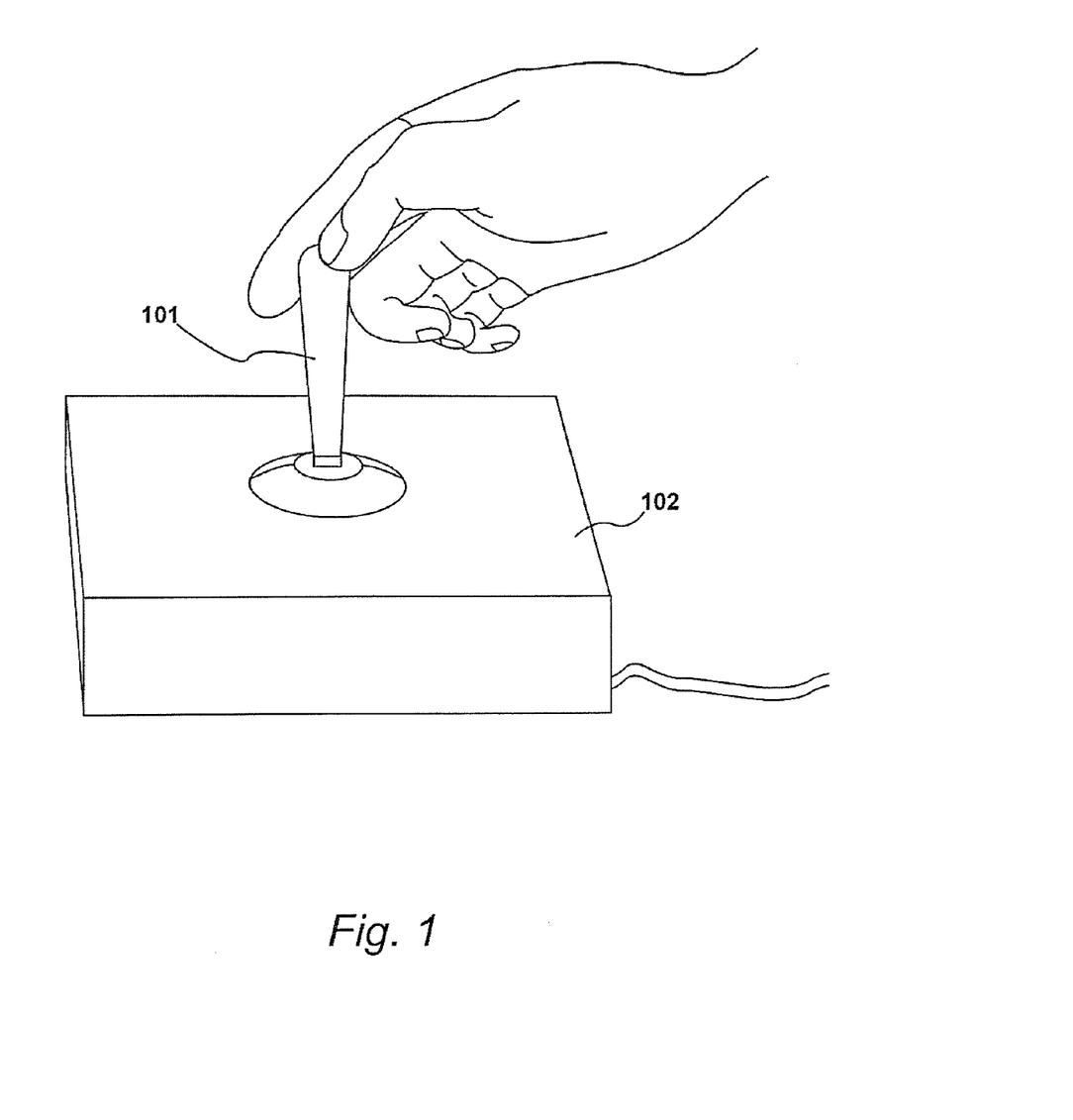
FIG. 1 is a perspective view of a manually operable joystick supported by a base unit.

FIG. 1

An environment that makes use of a sensor or a plurality of sensors is illustrated in FIG. 1. In this example, a manually operable joystick 101 is provided supported by a base unit 102. The joystick 101 is moveable with respect to the base unit 102 and when moved pressure is applied to a sensor that is responsive to the external forces being applied thereto.

Figure 2:
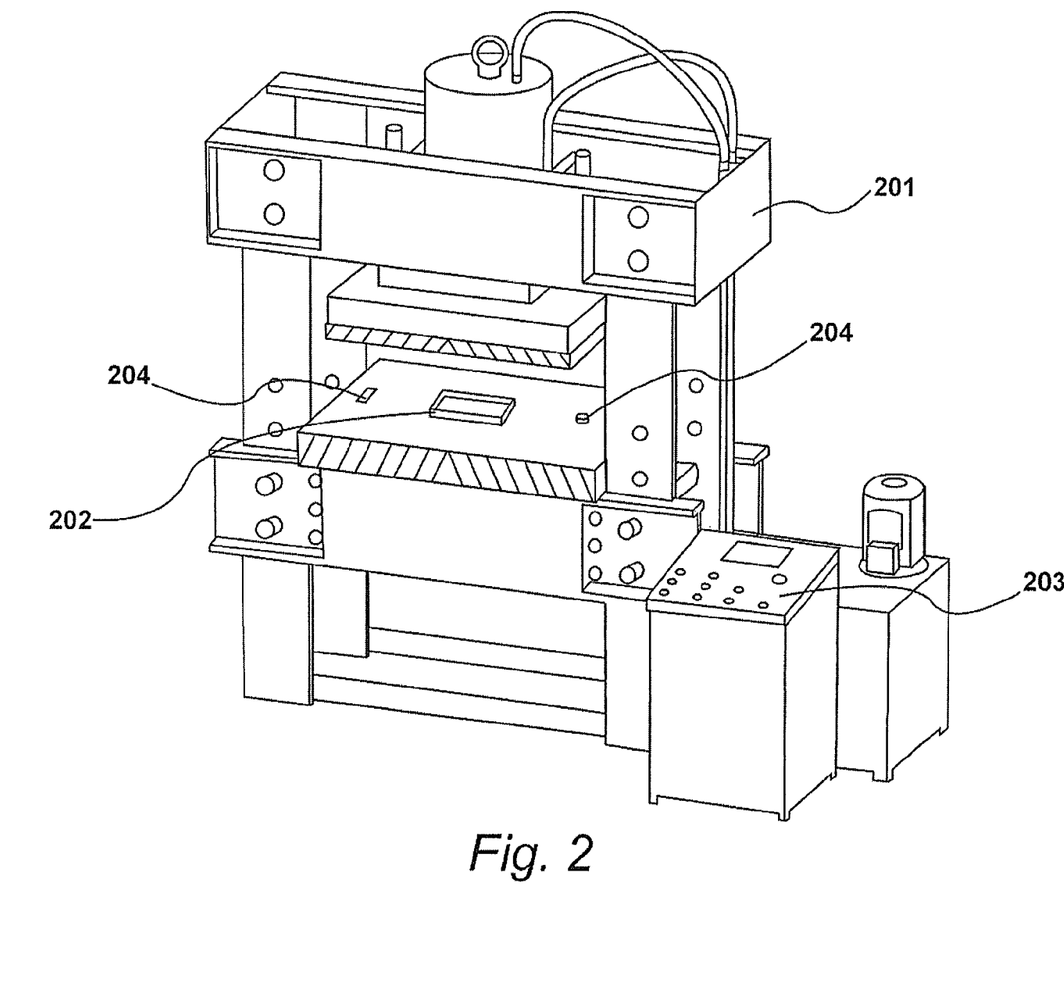
FIG. 2 is a perspective view of a press.

FIG. 2

An alternative environment is illustrated in FIG. 2 in which a press 201 applies force against a workpiece 202 so as to press the workpiece into a desired shape. The press operates with a plurality of control mechanisms 203 and as such it is necessary for the degree of pressure to be determined. Thus, again, sensors 204 are included that are configured to experience resistance changes in response to the external pressure being applied.

In this environment, some work-pieces are relatively delicate and require a modest degree of pressure controlled to a high degree of accuracy. In addition, other work pieces require significant levels of pressure in order to effect the required level of deformation. A difficulty therefore arises in terms of including sensors that are sensitive to low levels of pressure while at the same time are capable of experiencing wide ranges of pressure when high levels of force are being applied.

Sensors are known that have two connections connecting respective interdigitated electrodes. Sensors are also known that have two terminals with a first terminal connected to a top electrode and a second terminal connected to a bottom electrode. The inventors have found that significantly different sensitivities can be achieved with the same pressure sensitive material depending on its method of deployment. If top and bottom electrodes are used a very sensitive sensor results, capable of responding to low forces but having a response that flattens off when high forces are applied. If interdigitated fingers are deployed, a less sensitive sensor is created which is insensitive to low forces but which continues to show a response up to a much higher level of force.

To achieve the benefits of both methods, the inventors investigated options in which a sensor has an interdigitated electrode structure on one side and a single electrode on the other, coated with pressure sensitive material. Such a sensor has three terminals, one to either side of the interdigitated electrodes and one to the single electrode behind the pressure sensitive material. The sensor could then be read in one of three ways. In a first, the interdigitated electrodes are combined and a measurement is taken between one side and the other. Thus, in this first mode of operation, the interdigitated electrodes are combined together to effectively form a single electrode.

In a second mode of operation, measurements are taken between interdigitated electrodes.

The third mode of operation involves combining one interdigitated electrode with the single electrode and taking a reading from the second interdigitated electrode, and, as will be described below, this mode of operation provides the sensor with sensitivity over a wider range of forces.

Figure 3:
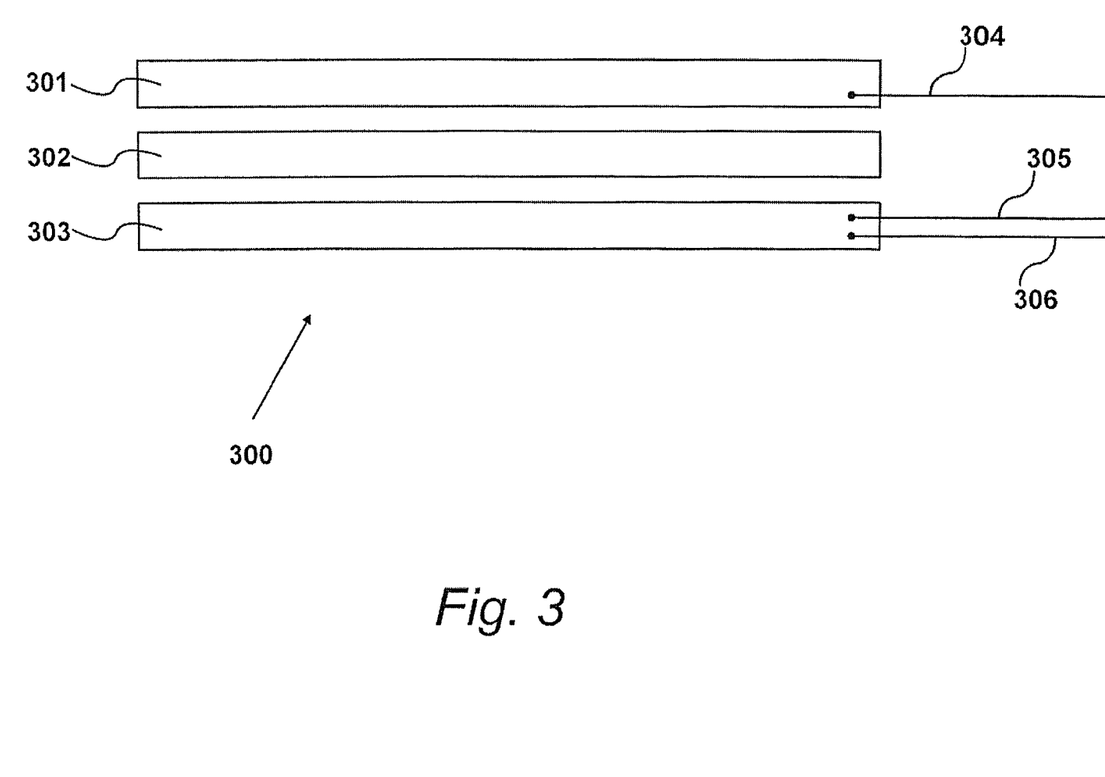
FIG. 3 shows a representation of the layered structure of a sensor embodying an aspect of the present invention.

FIG. 3

A sensor 300 having a layered structure and embodying the present invention is shown in FIG. 3. The sensor has a first layer 301, a second layer 302 and a third layer 303; the second layer 302 extending in between the outer layers (i.e. first layer 301 and third layer 303).

For the purposes of clarity, the three layers 301, 302 and 303 are shown spaced apart in FIG. 3. However, it should be understood that in reality the central second layer is in mutual contact with both of the outer layers 301 and 303.

The first layer 301 is of a conductive material and has a connection to a single electrode 304. In the present embodiment the first layer is fabricated from a metallic material, in this case copper, but alternatively it may be formed of a conductive fabric. The second intermediate layer 302 is formed of a material having a resistance sensitive to an external interaction and in the present embodiment it is fabricated from a quantum tunnelling composite. The second intermediate layer 302 is not connected to an electrode.

In the present embodiment the second intermediate layer is printed directly onto the first layer 301, but in an alternative embodiment the second intermediate layer is printed directly onto the third layer 303. The third layer is fabricated from an electrically conducting material, which in the present embodiment is copper, but other such metallic materials are used in alternative embodiments. The third layer 303 consists of a first set of fingers interdigitated with a second set of fingers (shown in FIG. 4). The first set of fingers and the second set of fingers are attached to a second electrode 305 and a third electrode 306 respectively. As shown in FIG. 3, there are therefore three connections to electrodes 304, 305 and 306.

In a preferred configuration of the sensor, the first electrode 304 is connected to one of said second electrode 305 or said third electrode 306 to make a parallel connection. In use, resistance (or an alternative characteristic such as impedance or conductance) is measured between said parallel connection and the remaining third or second electrode.

Figure 4:
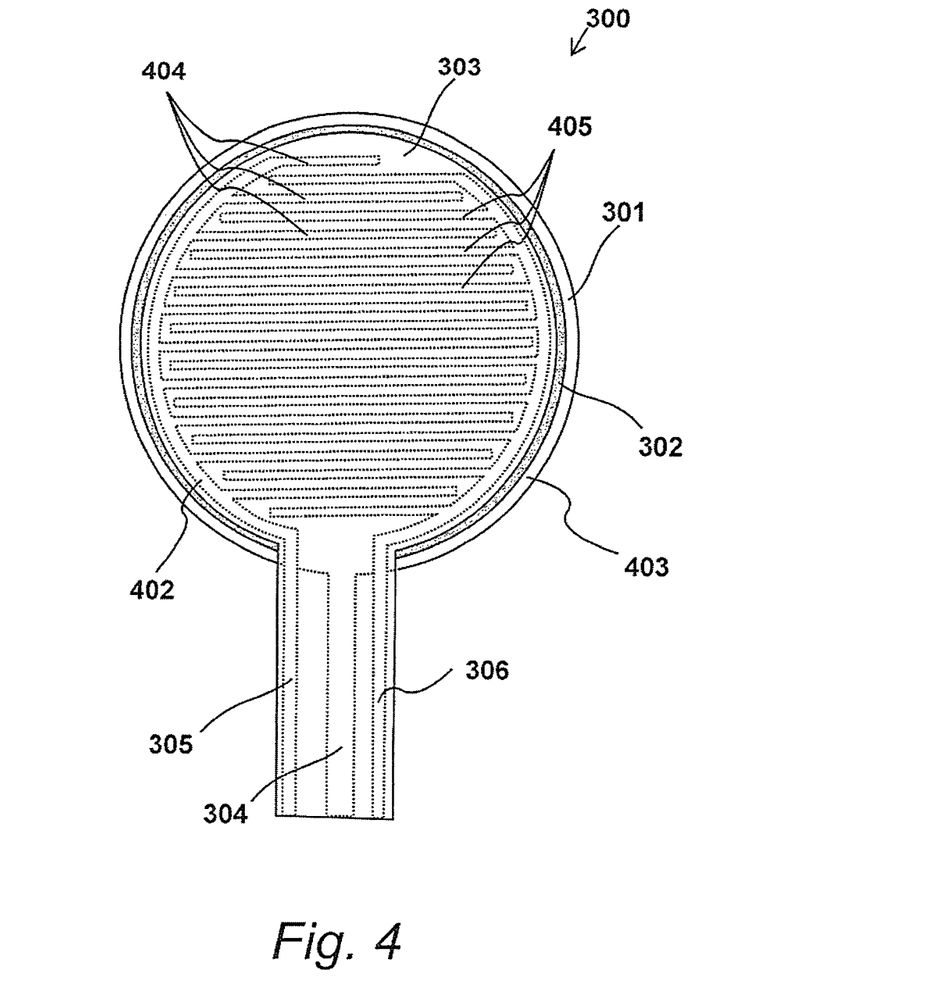
FIG. 4 shows a generalised representation of the sensor according to the invention.

FIG. 4

A bottom view of the sensor 300 is shown in FIG. 4. The sensor 300 has an interdigitated electrode structure 402 on one side and a single electrode structure 403 (formed on first layer 301) on the other side.

The interdigitated electrode structure 402 consists of a first set of fingers 404 interdigitated with a second set of fingers 405. The first set of fingers 404 are connected to the electrode 305, and the second set of fingers 405 are connected to the electrode 306. The interdigitated electrode structure 402 may be constructed from a metallic material, such as copper or silver, or alternatively carbon. The interdigitated electrode structure 402 or the single electrode structure 403 is coated in a pressure sensitive material to form the intermediate layer 302. This pressure sensitive material is a quantum tunnelling composite.

Figure 5:
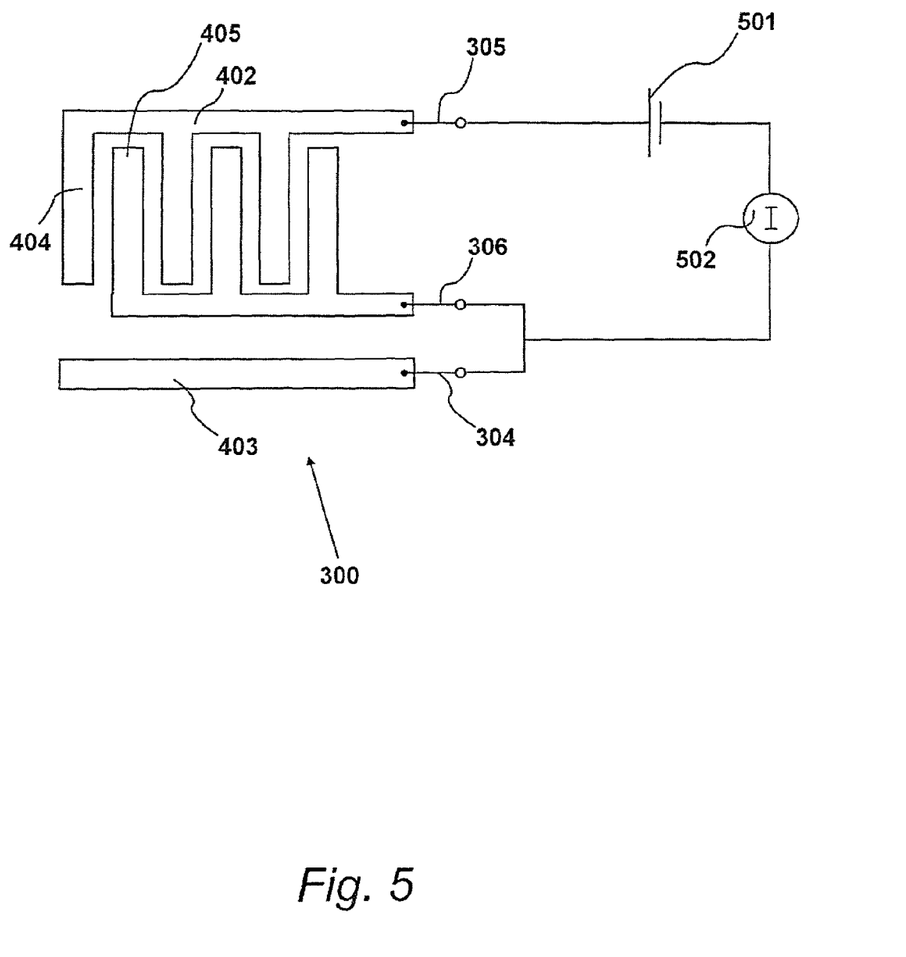
FIG. 5 shows a representation of an electric circuit operating the sensor in a first configuration.

FIG. 5

A representation of an electrical circuit 500 operating the sensor 300 in a first configuration is shown in FIG. 5. The sensor 300 with the interdigitated electrode structure 402 on one side and the single electrode structure 403 on the other side is shown. The interdigitated electrode structure 402 consists of the first set of fingers 404 interdigitated with a second set of fingers 405.

As mentioned above, the single electrode 403 may be connected to either of the second electrode 305 or the third electrode 306, and resistance may be measured between the parallel connection and the remaining third electrode 507 or second electrode 506. In the present embodiment, shown in FIG. 5, the single electrode 403 is connected to the third electrode 306.

The first electrode 304 and third electrode 306 of sensor 300 are connected in parallel to a first terminal of a voltage supply (in the present example battery 501) via a current measuring device (in the present example ammeter 502). The second electrode 305 is connected to the other terminal of the voltage supply. Thus, a voltage is applied between the second electrode 305 and the first and third electrodes (which are connected in parallel).

Although it is not shown in FIG. 5, it should be understood that the second layer is able to provide electrical conduction from the first set of fingers 404 to both the second set of fingers 405 and single electrode structure 403. Therefore, the second layer completes the circuit.

The second layer has a resistance that varies depending upon pressure that is applied to it. In general terms, the resistance of the second layer reduces as pressure is applied. Consequently, the measurement provided by the ammeter 502 provides an indication of pressure applied to the sensor 300.

Response curves for sensors such as sensor 300 using the circuit of FIG. 5 are described below with reference to FIGS. 8 to 11.

In the present examples, the circuit used to operate the sensor 300 supplies direct current (d.c.) voltage and consequently the measurement obtained from the ammeter 502 depends upon the resistance of the second layer of the sensor. However, it is also possible to supply the sensor with alternating current (a.c.) and in which case measurements are performed that depend upon the impedance of the sensor.

Figure 6:
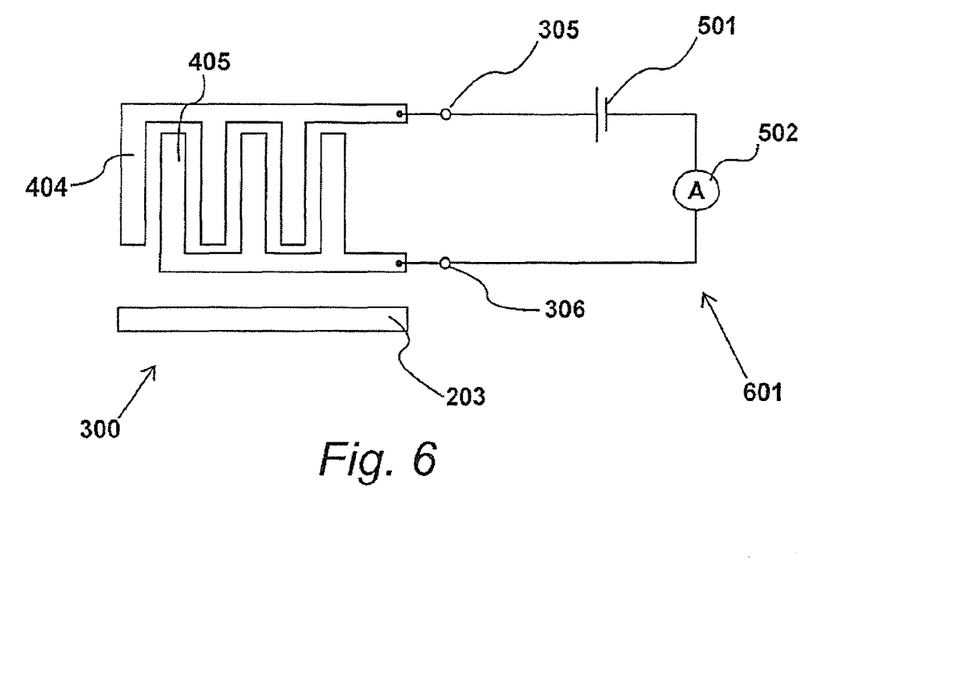
FIG. 6 shows a representation of a second electrical circuit 601 operating the sensor 300 in a second configuration.

FIG. 6

A representation of a second electrical circuit 601 operating the sensor 300 in a second configuration is shown in FIG. 6.

The first electrode 304 of the sensor 300 is disconnected, and third electrode 306 is connected to a first terminal of a voltage supply (in the present example battery 501) via a current measuring device (in the present example ammeter 502). The second electrode 305 is connected to the other terminal of the voltage supply. Thus, a voltage is applied between the second electrode 305 and the third electrode 306, while the first electrode is left floating.

Although it is not shown in FIG. 6, it should be understood that the second layer is able to provide electrical conduction from the first set of fingers 404 to the second set of fingers 405, and also between each set of fingers and the single electrode structure 403. Consequently, when pressure is applied to the sensor 300, current is able to flow from the first set of fingers 404 to the second set of fingers 405, and also from the first set of fingers 404 through the second layer to the single electrode structure 403 and to the second set of fingers 405.

The second layer has a resistance that varies depending upon pressure that is applied to it, and consequently the current measured by the ammeter 502 increases as pressure applied to the sensor 300 increases. However, as described below with reference to FIGS. 8 to 11, the response curves produced by sensors, such as sensor 300, in the circuit of FIG. 6 are substantially different to those of the sensors when operated in the circuit of FIG. 5.

Figure 7:
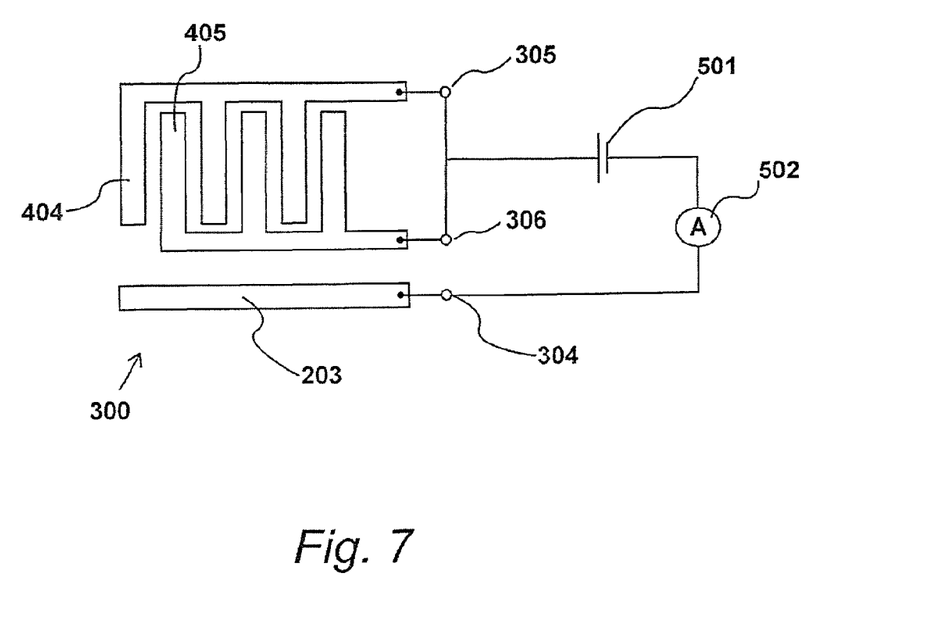
FIG. 7 shows a representation of a third electrical circuit 701 operating the sensor 300 in a third configuration.

FIG. 7

A representation of a third electrical circuit 701 operating the sensor 300 in a third configuration is shown in FIG. 7.

In this configuration, the second electrode 305 and the third electrode 306 are connected in parallel, and resistance is measured between the parallel connection and the first electrode 304.

The second and third electrodes 305 and 306 are connected to one terminal of a battery 501 while the first electrode 304 is connected to the other terminal of the battery via ammeter 502. When a force is applied to the sensor 300, current is able to flow from the first and second set fingers 404 and 405 through the second layer (not shown) to the single electrode structure 403.

Again, current measured by ammeter 502 increases as force applied to the sensor 300 increases. However, as described below with reference to FIGS. 8 to 11, the response curves (resistance versus force) produced by sensors, such as sensor 300, in the circuit of FIG. 7 are substantially different to those of the sensors when operated in either of the circuits of FIG. 5 or FIG. 6.

Figure 8:
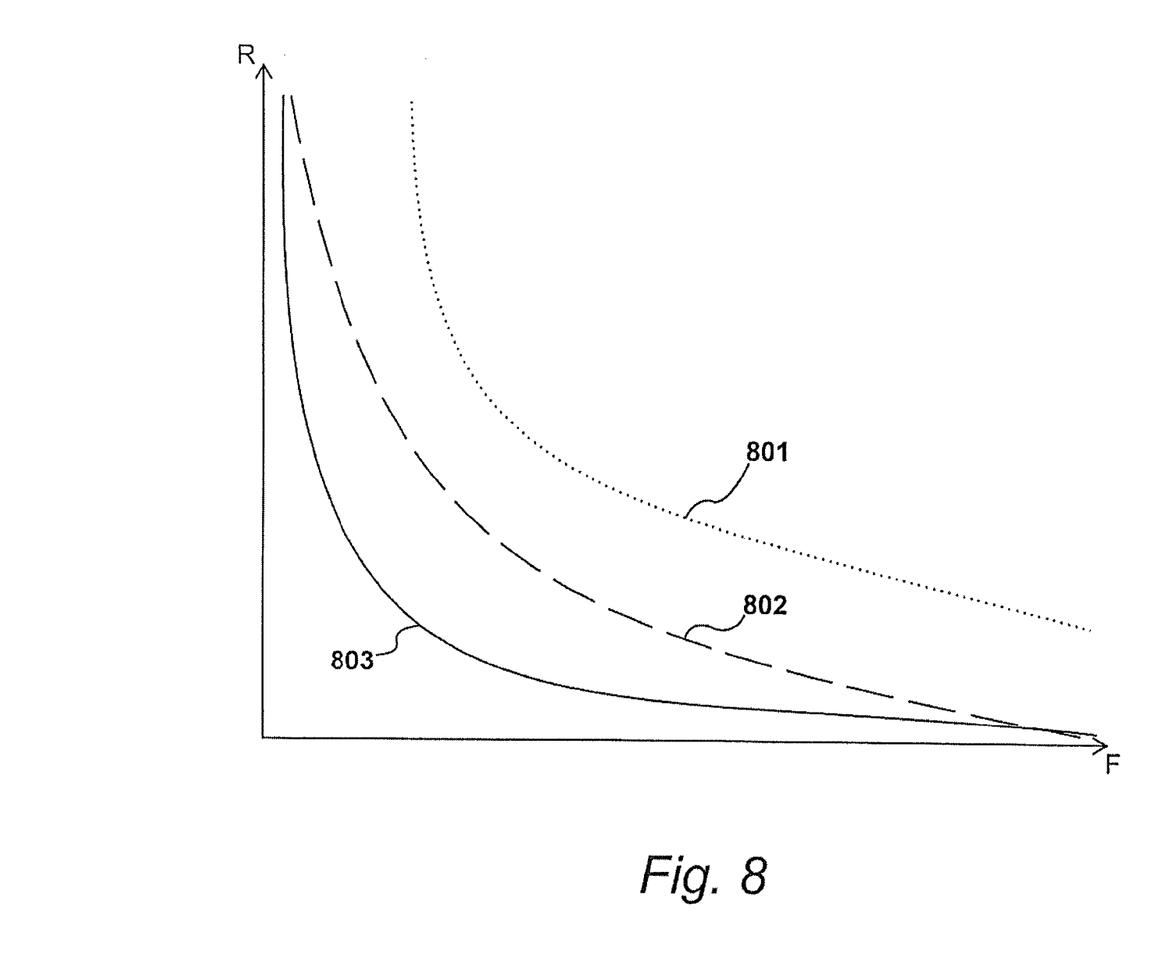
FIG. 8 is a graphical representation of the force-resistance profiles for different readings of an embodiment of the sensor.

FIG. 8

A graphical representation of the force-resistance (F-R) profiles for different configurations of a sensor, such as sensor 300 are shown in FIG. 8. The vertical axis measures resistance (R) whilst the horizontal axis measures application of force (F). In the embodiment shown in FIG. 8, the detector has a first layer of a conductive material having a first electrode connected giving a single electrode structure and a third layer having an interdigitated finger electrode structure. A second intermediate later fabricated from a quantum tunnelling composite is printed onto the single electrode structure.

The top dotted line 801 represents a measurement across the interdigitated finger electrode as described with reference to FIG. 6. This configuration gives poor first touch sensitivity (ie. the resistance remains high for low loads) but continues to change up to high loads. In this configuration, the current path through the sensor is up one set of interdigitated fingers and through the intermediate layer, fabricated from a quantum tunnelling composite giving a pressure sensitive variation. The current path then moves through the single electrode, back through the intermediate layer, fabricated from a quantum tunnelling composite to the second set of interdigitated fingers, giving a second pressure sensitive result. Such a measurement is useful for the detection of high force applications.

The lowermost solid line 803 represents a measurement through the sensor, from the layer having the interdigitated electrode structure to the layer with the single electrode structure as described with reference to FIG. 7. This represents a typical measurement through a sensor having top and bottom solid electrodes. As illustrated, this configuration provides a very sensitive sensor responding to low forces but which flattens off when high forces are applied.

The middle dashed line 802 represents a measurement in a sensor according to an embodiment of the invention, wherein the first electrode (connected to the first layer of conductive material) is connected to one of said second electrode or said third electrode (connected to the first and second set of interdigitated fingers respectively) to make a parallel connection. The resistance is measured between said parallel connection and the remaining third or second connection. Thus, this curve corresponds to the circuit shown in FIG. 5. As illustrated, such a parallel measurement gives good first touch sensitivity and continues to change up to the application of relatively high forces. Thus, a sensor configured in the manner of FIG. 5, i.e. with the first electrode 306 connected directly to the third electrode 306 benefits from a much extended force resistance curve, still being sensitive to low forces but continuing to show a response up to high force loads.

Figure 9:
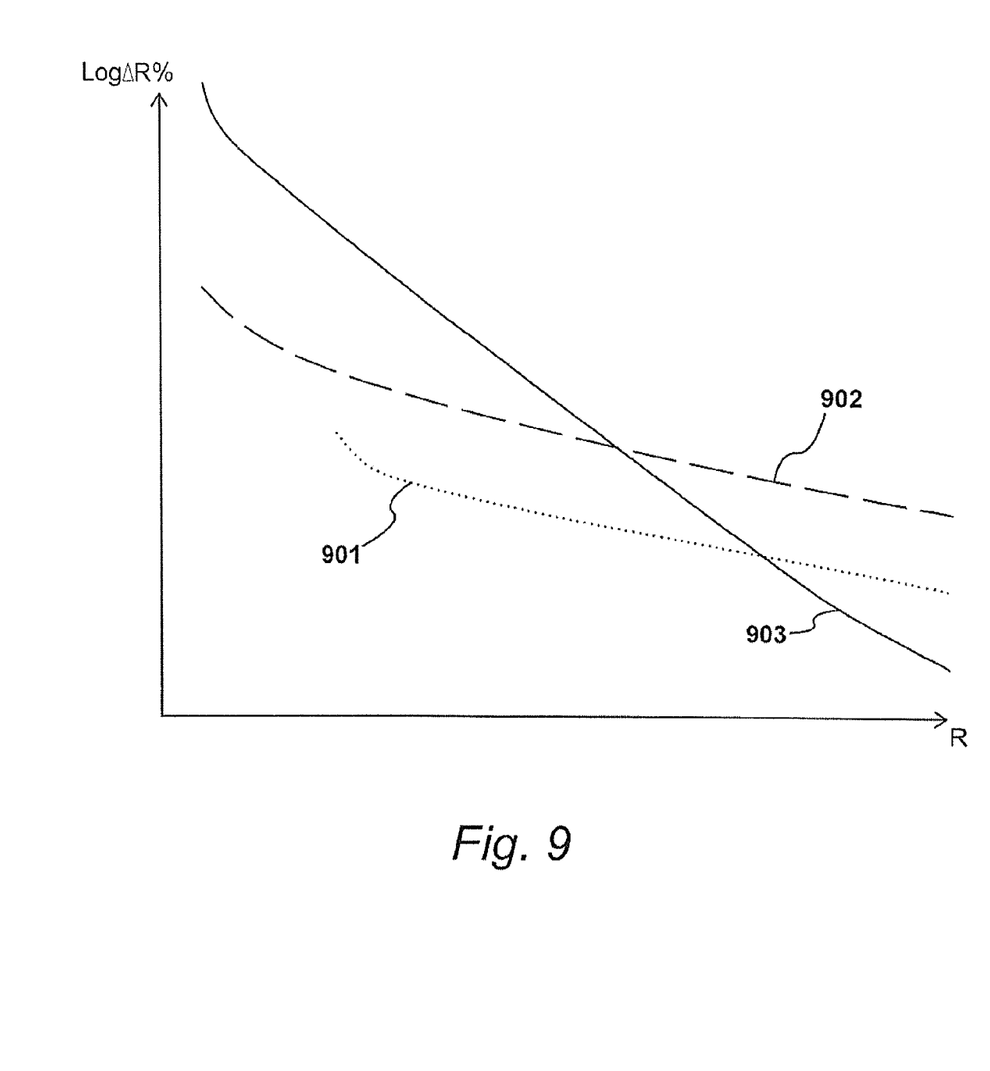
FIG. 9 is a graphical representation of the force-resistance profiles for different readings of an embodiment of the sensor, on a logarithmic scale.

FIG. 9

FIG. 9 shows a representation of the sensor profiles described in FIG. 8 on a logarithmic scale, wherein the intermediate layer of the sensor which is sensitive to external interaction and is preferably fabricated from a quantum tunnelling composition is printed onto the single electrode structure.

The dotted line 801 represents a measurement across the interdigitated finger electrode, which shows a good resistance changing response up to high loads but has a poor response at low loads.

The solid line 803 represents a measurement through the sensor, from the layer having the interdigitated electrode structure to the layer with the single electrode structure. This represents a typical measurement through a sensor having top and bottom solid electrodes. A sensor which shows good resistance changes at low loads but which reduces at high loads is seen.

The dashed line 802 represents a measurement in a sensor according to an embodiment, wherein the first electrode (connected to the first layer of conductive material) is connected to one of said second electrode or said third electrode (connected to the first and second set of interdigitated fingers respectively) to make a parallel connection. The resistance is measured between said parallel connection and the remaining third or second connection. Such a parallel measurement gives a good balanced changing resistance through the force range.

Figure 10:
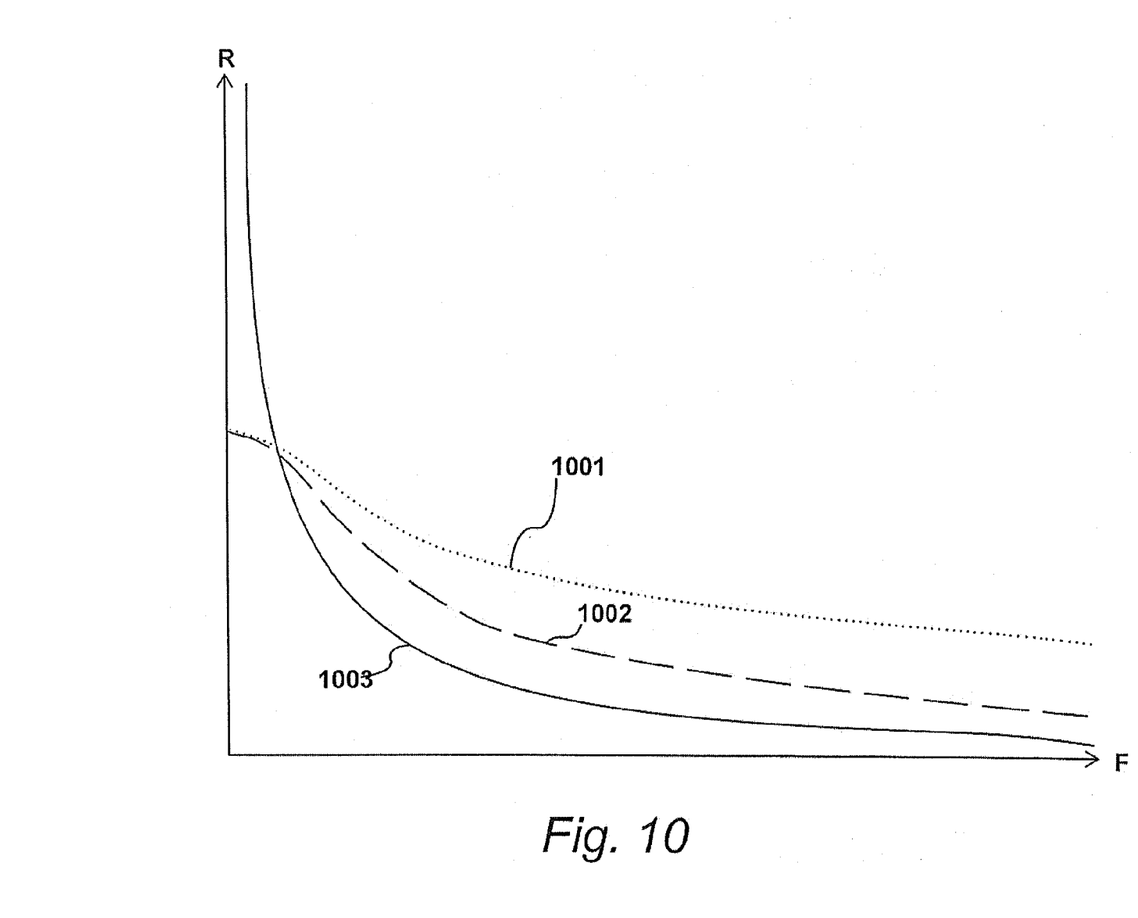
FIG. 10 is a further graphical representation of the force-resistance profiles for different readings of a preferred embodiment of the sensor.

FIG. 10

A graphical representation of the F-R profiles for different readings of an embodiment of the sensor is shown in FIG. 10. The vertical axis measures resistance (R) whilst the horizontal axis measures application of force (F).

The sensor used for the F-R profile shown in FIG. 10 has a first layer of a conductive material having a first electrode connected thereto and a third layer having an interdigitated finger electrode structure. A second intermediate later, fabricated from a quantum tunnelling composite is printed onto the interdigitated finger electrode structure. This embodiment therefore differs from the embodiment described in the paragraph detailing the profiles shown in FIG. 8 in that the intermediate layer is printed onto the interdigitated finger electrode structure rather than onto the single electrode structure.

The top dotted line 1001 represents a measurement across the interdigitated finger electrodes and therefore corresponds to the circuit of FIG. 6. A shown, this arrangement gives a start resistance of the quantum tunnelling composite sheet resistance but little change in resistance through the force range.

The lowermost solid line 1003 represents a measurement through the sensor, from the layer having the interdigitated electrode structure to the layer with the single electrode structure, and therefore corresponds to the circuit of FIG. 7. This represents a typical measurement through a sensor having top and bottom solid electrodes. This measurement gives good first touch sensitivity but flattens out at high loads.

The middle dashed line 1002 represents a measurement in a sensor according to the present invention, wherein the first electrode (connected to the first layer of conductive material) is connected to one of said second electrode or said third electrode (connected to the first and second set of interdigitated fingers respectively) to make a parallel connection. Thus this Figure corresponds to the circuit of FIG. 5. The resistance is measured between said parallel connection and the remaining third or second connection. Such a parallel measurement has the start resistance of the quantum tunnelling composite sheet resistance and shows an improved range through the force range.

A sensor configured in the manner of FIG. 5 benefits from a much extended force resistance curve, still being sensitive to low forces but continuing to show a response up to high force loads.

Figure 11:
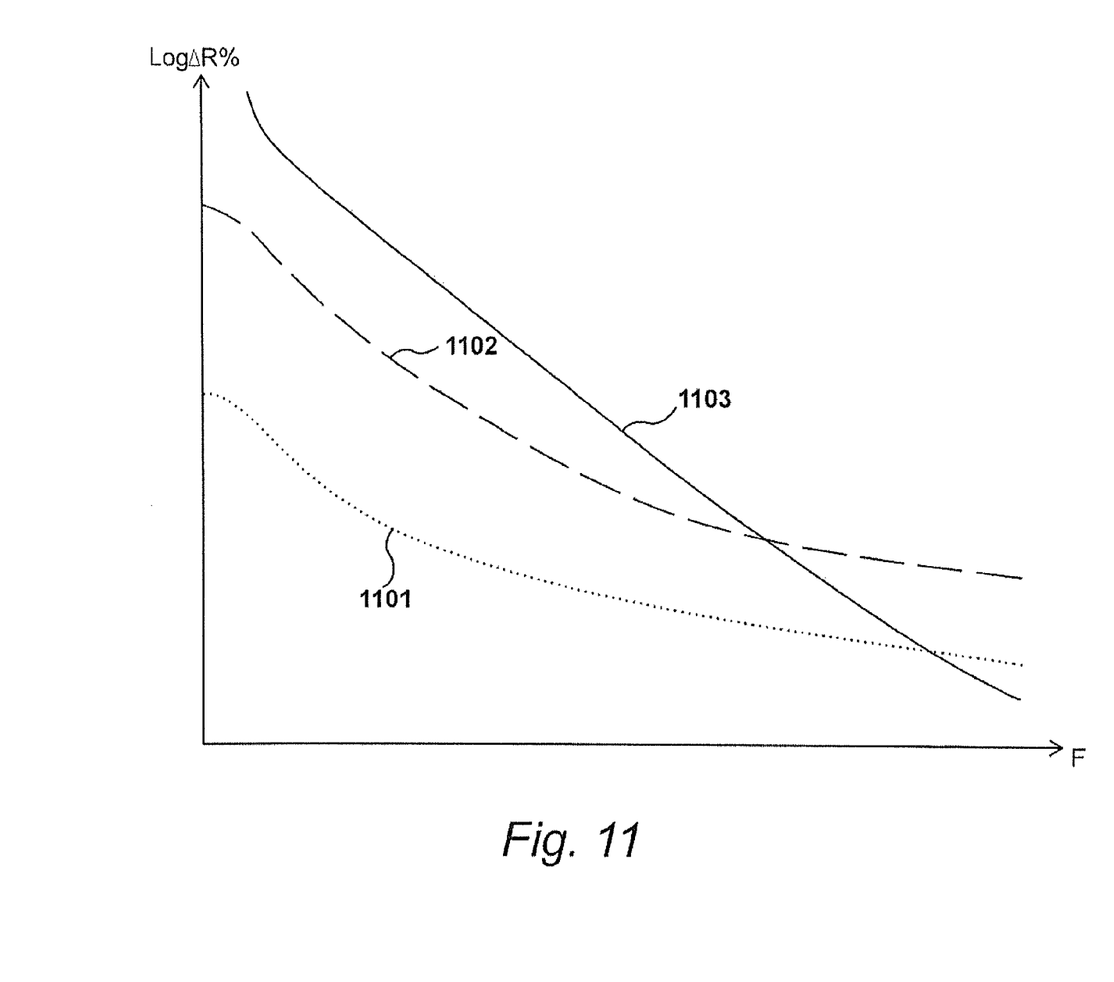
FIG. 11 is a further graphical representation of the force-resistance profiles for different readings of a preferred embodiment of a sensor, on a logarithmic scale.

FIG. 11

FIG. 11 shows a representation of the sensor profiles described in FIG. 10 on a logarithmic scale, wherein the intermediate layer of the sensor which is sensitive to external interaction and is preferably fabricated from a quantum tunnelling composite, is printed onto the interdigitated electrode structure.

The dotted line 1101 represents a measurement across the interdigitated finger electrodes, and therefore corresponds to the sensor configuration shown in FIG. 7. The curve 1101 shows a good resistance changing response up to high loads but nothing at low loads.

The solid line 1103 represents a measurement through the sensor, from the layer having the interdigitated electrode structure to the layer with the single electrode structure, and so corresponds to the arrangement of FIG. 8. This represents a typical measurement through a sensor having top and bottom solid electrodes. This arrangement provides a sensor which shows good resistance changes at low loads but which reduces at high loads.

The dashed line 1102 represents a measurement in a sensor according to an embodiment of the invention, wherein the first electrode (connected to the first layer of conductive material) is connected to one of said second electrode or said third electrode (connected to the first and second set of interdigitated fingers respectively) to make a parallel connection. I.e. it corresponds to the sensor configuration shown in FIG. 5. The resistance is measured between said parallel connection and the remaining third or second connection. Such a parallel measurement gives a balanced change of resistance through the force range.

Embodiments described above show a sensor configured to experience resistance changes in response to an external interaction taking the form of applied force or applied pressure. It should also be appreciated that sensors of this type may be deployed to identify other physical interactions. For example, the resistivity of the intermediate layer may change in response to changes in temperature or in response to changes in an applied radiation. The applied radiation may take the form of heat or may take the form of an ionising radiation.

Figure 12:
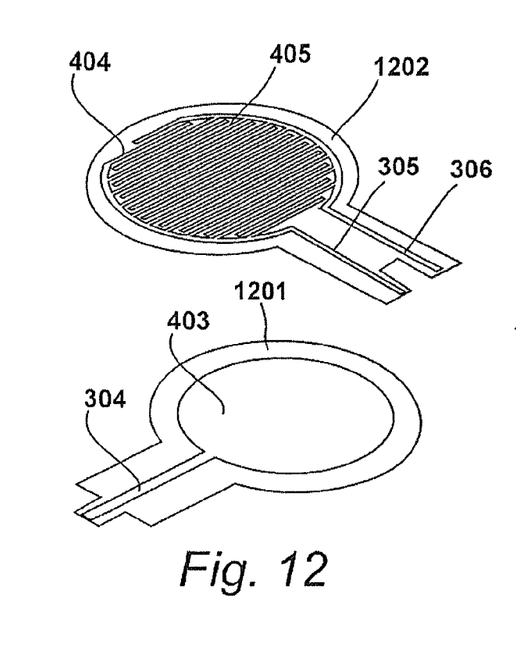
FIGS. 12, 13 and 14 illustrate a method of manufacturing a sensor embodying the present invention.
Figure 13:
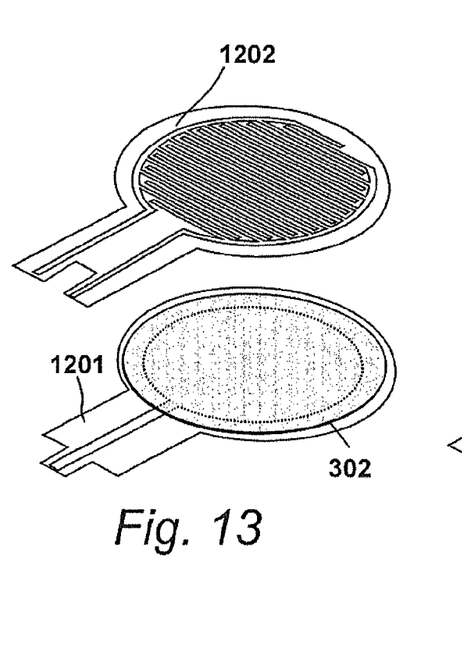
Figure 14:
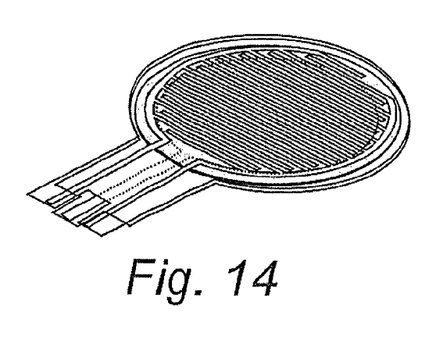

FIGS. 12, 13 and 14

A method of manufacturing an embodiment of sensor 300 is illustrated in FIGS. 12, 13 and 14. Initially a pair of suitably shaped sheets 1201 and 1202 of insulating material is formed as shown in the perspective view of FIG. 12. Typically the sheets are formed of a plastics material, and in the present case they are formed of PTE sheet. (For sensors that are intended to detect airborne chemicals, the sheets are formed from a permeable membrane, for example in one embodiment the sheets are formed from a textile material.) The single electrode structure 403 and first electrode 304 are formed on the first sheet 1201 by printing conducting ink, which in the present example comprises silver-loaded ink. Similarly, the interdigitated fingers 404 and 405 and the second and third electrode 305 and 306 are formed on the second sheet 1202 by printing conducting ink.

When the conducting ink is dry, the first sheet 1201 is coated with quantum tunnelling ink to form the second layer 302. The quantum tunnelling ink comprises particles of a conductive or semi-conductive powdered material dispersed within a polymeric liquid binder. At least some of the particles are spiky or needle shaped to enable quantum tunnelling between particles when a voltage is applied across the layer 302. In the present embodiment, the quantum tunnelling ink is as described within the applicant's co-pending US patent application published as US 2010/0062148, the entire contents of which are incorporated herein by reference. The quantum tunnelling ink used to form the second layer is available from Peratech Limited of the United Kingdom.

As shown in FIG. 13, the single electrode structure 403 is covered by the quantum tunnelling ink. The quantum tunnelling ink is dried before the second sheet 1202 is positioned over the first sheet and the two are brought together so that the interdigitated fingers 404 and 405 are brought into contact with the second layer 302 to form the sensor shown in FIG. 14.

In an alternative embodiment, the quantum tunnelling ink is printed onto the second sheet 1202 to form the second layer 302 over the interdigitated fingers 404 and 405. This is allowed to dry before the first electrode 304 (on the first sheet 1201) is positioned on the second layer.

The invention claimed is:

1. A sensor configured to experience changes in an electrical characteristic in response to an external interaction, said sensor comprising:
a first layer, a second layer and a third layer;
said first layer being comprised of a conductive material;
a first electrode connected to said first layer;
said second layer being interposed between said first layer and said third layer;
said second layer providing electrical conduction between said first layer and said third layer and being formed of a quantum tunnelling composite having an electrical characteristic sensitive to an external interaction;
said third layer being comprised of a first set of conductive fingers interdigitated with a second set of conductive fingers;
a second electrode attached to said first set of fingers; and
a third electrode attached to said second set of fingers;
said first electrode being electrically connected to a selected one electrode of said second electrode and said third electrode, thereby establishing a parallel electrical connection between said selected one electrode and said first electrode, while leaving a remaining non-selected one electrode of said second electrode and said third electrode;
whereby upon application of a voltage between the parallel connection and the non-selected one electrode, a measurement dependent upon the electrical characteristic of said second layer will be made available.

2. The sensor of claim 1, wherein said quantum tunnelling composite is printed directly onto the first layer of a conductive material having a first electrode connected thereto.

3. The sensor of claim 1, wherein said quantum tunnelling composite is printed directly onto said third layer comprised of a first set of fingers interdigitated with a second set of fingers.

4. The sensor of claim 1, wherein said second layer is formed of a composite material comprising a plurality of conductive or semi-conductive particles dispersed within a polymeric material.

5. The sensor of claim 1, wherein said first layer of conductive material is comprised of a metallic material.

6. The sensor of claim 1, wherein said metallic material includes at least one of silver-loaded ink and carbon loaded ink.

7. The sensor of claim 1, wherein said first layer of conductive material is comprised of a fabric.

8. The sensor of claim 1, wherein said third layer is comprised of a metallic material.

9. The sensor of claim 8, wherein said metallic material includes at least one of silver-loaded ink and carbon loaded ink.

10. The sensor of claim 1, wherein said external interaction comprises a mechanical interaction.

11. The sensor of claim 10, wherein said mechanical interaction includes the application of pressure.

12. The sensor of claim 1, wherein said external interaction includes the application of radiation.

13. An electrical circuit including the sensor of claim 1, said electrical circuit comprising a voltage source configured to apply a voltage between said parallel electrical connection and the non-selected one electrode of said third electrode and said second electrode, and a measurement device configured to provide a measurement dependent upon the electrical resistance of said second layer.

14. An electrical circuit including the sensor of claim 1, said electrical circuit comprising a voltage source configured to apply a voltage between said parallel electrical connection and the non-selected one electrode of said third electrode and said second electrode, and a measurement device configured to provide a measurement dependent upon electrical impedance of said sensor.

15. An electrical circuit including the sensor of claim 1, said electrical circuit comprising a voltage source configured to apply a voltage between said parallel electrical connection and the non-selected one electrode of said third electrode and said second electrode, and a measurement device configured to provide a measurement dependent upon current flowing from said parallel electrical connection and the non-selected one electrode of said third electrode and said second electrode.

16. A method of constructing a sensor for detecting an external interaction by effecting a change in resistance, the method comprising the steps of:
providing a first layer of a conductive material;
attaching a first electrode to said first layer of a conductive material;
providing a second layer of an electrically conductive material having a resistance sensitive to external interactions;
providing a third layer consisting of a first set of fingers interdigitated with a second set of fingers;
interposing said second layer between said first layer and said third layer thereby establishing electrical conduction between said first layer and said third layer;
attaching a second electrode to said first set of fingers;
attaching a third electrode to said second set of fingers;
connecting said first electrode to said second electrode to establish a parallel connection between said first electrode and said second electrode;
applying a voltage between said parallel connection and the third electrode; and
measuring an electrical signal to obtain a measurement dependent upon current flowing from said parallel connection to the third electrode.

17. The method of claim 16, wherein said second layer is fabricated from quantum tunnelling composite.

18. The method of claim 16 wherein said external interaction comprises pressure applied to said sensor.

* * * * *